US012140725B2

(12) United States Patent
AlSinan et al.

(10) Patent No.: US 12,140,725 B2
(45) Date of Patent: Nov. 12, 2024

(54) DETERMINING RESERVOIR FORMATION PROPERTIES

(71) Applicants: Saudi Arabian Oil Company, Dhahran (SA); King Abdullah University of Science and Technology, Thuwal (SA)

(72) Inventors: Marwah Mufid AlSinan, Al Qatif (SA); Xupeng He, Thuwal (SA); Hyung Tae Kwak, Dhahran (SA); Hussein Hoteit, Thuwal (SA); Yiteng Li, Thuwal (SA)

(73) Assignee: Saudi Arabian Oil Company and King Abdullah University of Science and Technology, Dhahran (SA)

( * ) Notice: Subject to any disclaimer, the term of this patent is extended or adjusted under 35 U.S.C. 154(b) by 56 days.

(21) Appl. No.: 18/082,017

(22) Filed: Dec. 15, 2022

(65) Prior Publication Data
US 2024/0201413 A1 Jun. 20, 2024

(51) Int. Cl.
*G01V 3/38* (2006.01)
*G01V 3/14* (2006.01)
(Continued)

(52) U.S. Cl.
CPC .............. *G01V 3/38* (2013.01); *G01V 3/14* (2013.01); *G01V 5/12* (2013.01); *G06F 30/27* (2020.01); *G06N 3/0442* (2023.01)

(58) Field of Classification Search
None
See application file for complete search history.

(56) References Cited

U.S. PATENT DOCUMENTS 6,008,645 A * 12/1999 Bowers ............... G01V 3/14
324/362
9,285,301 B2 3/2016 De Prisco et al.
(Continued)

FOREIGN PATENT DOCUMENTS

EP 2972303 8/2020
WO WO 2016137472 9/2016
(Continued)

OTHER PUBLICATIONS

Alhwety et al., "Rock-typing of Laminated Sandstones by Nuclear Magnetic Resonance in the Presence of Diffusion Coupling," Journal for the Basic Principles of Diffusion Theory, Experiment and Application, 2014, 7 pages.
(Continued)

*Primary Examiner* — Lina Cordero
(74) *Attorney, Agent, or Firm* — Fish & Richardson P.C.

(57) ABSTRACT

Techniques for determining reservoir formation properties include generating digital models of core samples taken from one or more reservoir formations based on corresponding images of the core samples; determining a pore throat size distribution of the core samples based on the generated digital models; determining corresponding capillary pressure curves and corresponding NMR value distributions of the core samples with one or more numerical simulations; generating one or more machine-learning (ML) models based on the pore throat size distribution, corresponding capillary pressure curves, and corresponding NMR value distributions of the core samples; adjusting the one or more ML models with one or more reservoir data of the one or more reservoir formations; generating adjusted capillary pressure curves and NMR value distributions from the one or more adjusted ML models; and determining a reservoir formation specific pore throat size distribution from at least (Continued)

one of the adjusted capillary pressure curves or the adjusted NMR value distributions.

33 Claims, 12 Drawing Sheets

(51) Int. Cl.
    *G01V 5/12*           (2006.01)
    *G06F 30/27*         (2020.01)
    *G06N 3/0442*      (2023.01)

(56) References Cited

U.S. PATENT DOCUMENTS

| | | | |
|---|---|---|---|
| 10,161,891 | B1 | 12/2018 | Tian et al. |
| 10,198,804 | B2 | 2/2019 | Sungkorn et al. |
| 2014/0257702 | A1* | 9/2014 | Al-Ibrahim ............... G01V 9/02 702/7 |
| 2016/0328419 | A1 | 11/2016 | Safonov et al. |
| 2016/0370492 | A1* | 12/2016 | Chen .................... G01R 33/448 |
| 2021/0223192 | A1* | 7/2021 | Heidari .................... G01V 3/14 |
| 2022/0082517 | A1* | 3/2022 | Song .................... G01N 33/241 |

FOREIGN PATENT DOCUMENTS

| | | |
|---|---|---|
| WO | WO 2019232299 | 12/2019 |
| WO | WO 2020197587 | 10/2020 |

OTHER PUBLICATIONS

Alhwety et al., "Rock-typing of Thin-Bedded Reservoir Rock by NMR in the Presence of Diffusion Coupling," presented at the SPWLA 57th Annual Logging Symposium, Reykjavik, Iceland, Jun. 2016, 22 pages.

Anand et al., "Diffusional Coupling between Micro and Macroporosity for NMR Relaxation in Sandstones and Grainstones," Petrophysics, Aug. 2007, 48(4): 289-307, 19 pages.

Arns, "Comparison of experimental NMR measurements with simulated responses on digitized images of mono-mineralic rocks using Xray-CT," Symp. Soc. Coure Anal, 2009, 1-6, 6 pages.

Bakke et al., "3-D pore-scale modelling of sandstones and flow simulations in the pore networks," presented at the European 3-D reservoir Modelling Conference in Stavanger, Norway, Apr. 1996; SPE Journal, 2(2):136-149, 15 pages.

Grunewald et al., "A laboratory study of NMR relaxation times and pore coupling in heterogeneous media," Geophysics, Nov.-Dec. 2009, 74(6):E215-E221, 7 pages.

Guo et al., "Numerical simulation and parameter analysis of NMR T2-D distributions of tight sandstone saturated with a gas-water two-phase fluid," Journal of Natural Gas Science and Engineering, 2017, 37:502-511, 10 pages.

Guo et al., "Numerical simulation of multi-dimensional NMR response in tight sandstone," Journal of Geophysics and Engineering, 2016, 13(3):285-294, 10 pages.

He et al., "Application of machine-learning to construct equivalent continuum models from high-resolution discrete-fracture models," International Petroleum Technology Conference 2020, IPTC 2020, 19 pages.

Hoteit et al., "Three-dimensional modeling of mass transfer in porous media using the mixed hybrid finite elements and the random-walk methods," Mathematical Geology, 2002, 34(4):435-456, 22 pages.

Kenyon et al., "Nuclear magnetic resonance imaging—technology for the 21st century," Oilfield Review, Autumn 1995, 7(3):19-33, 16 pages.

Li et al., "Neural network modeling of in situ fluid-filled pore size distributions in subsurface shale reservoirs under data constraints," Neural Computing and Applications, 2020, 32:3873-3885, 19 pages.

Li et al., "Numerical Modeling of Nmr Surface Relaxation in Porous Media With Improved Pore Surface Area Evaluation and Derivation of Interfacial Absorption Probability," presented at the International Symposium of the Society of Core Analysts in St. John's Newfoundland and Labrador, Canada, Aug. 2015, 7 pages.

Minh et al., "Nmr T2 Fluids Substitution," Paper presented at the SPWLA 57th Annual Logging Symposium, Reykjavik, Iceland, Jun. 2016, 12 pages.

Mirzaei-Paiaman et al., "A new approach in petrophysical rock typing," Journal of Petroleum Science and Engineering, 2018, 166:445-464, 37 pages.

Navier-Stokes Equations, Darcy's Law and Multiphase Flow, in Multiphase Flow in Permeable Media: A Pore-Scale Perspective, Blunt, Cambridge University Press, 2017, 96 pages.

NMR logging, Coates et al., Halliburton Energy Services, USA, 253 pages.

Øren et al., "Extending Predictive Capabilities to Network Models," presented at the SPE Annual Technical Conference & Exhibition in San Antonio, U.S.A., Oct. 1997; Society of Petroleum Engineers, 1998, 3(4):324-335, 18 pages.

Ramakrishnan et al., "Forward models for nuclear magnetic resonance in carbonate rocks," The Log Analyst, Jul.-Aug. 1999, 40(4):260-270, 11 pages.

Santoso et al., "Application of machine-learning to construct simulation models from high-resolution fractured formation," presented at the Abu Dhabi International Petroleum Exhibition & Conference in Abu Dhabi, UAE, Nov. 2019; Society of Petroleum Engineers 2019, 14 pages.

Talabi et al., "Pore-scale network simulation of NMR response in two-phase flow," Journal of Petroleum Science and Engineering, 2010, 72(1-2):1-9, 9 pages.

Talabi et al., "Pore-scale simulation of NMR response," Journal of Petroleum Science and Engineering, 2009, 67(3-4):168-178, pages.

Talabi, "Pore-Scale simulation of NMR response in porous media," a dissertation submitted to the Department of Earth Science and Engineering, Imperial College of London in Partial Fulfillment of the Requirements for the Degree of Doctor of Philosophy, Sep. 2008, 163 pages.

Valvatne, "Predictive pore-scale modelling of multiphase flow. Measurement Science and Technology," a dissertation submitted to the Department of Earth Science and Engineering, Imperial College of London in Partial Fulfillment of the Requirements for the Degree of Doctor of Philosophy, 2004, 146 pages.

Wiewel et al., "Latent Space Physics: Towards Learning the Temporal Evolution of Fluid Flow," Computer Graphics Forum, 2019, 38(2):71-82, 16 pages.

Zhao et al., "A hybrid approach for the prediction of relative permeability using machine learning of experimental and numerical scale data," Proceedings—SPE Annual Technical Conference and Exhibition, Sep. 2019, 16 pages.

* cited by examiner

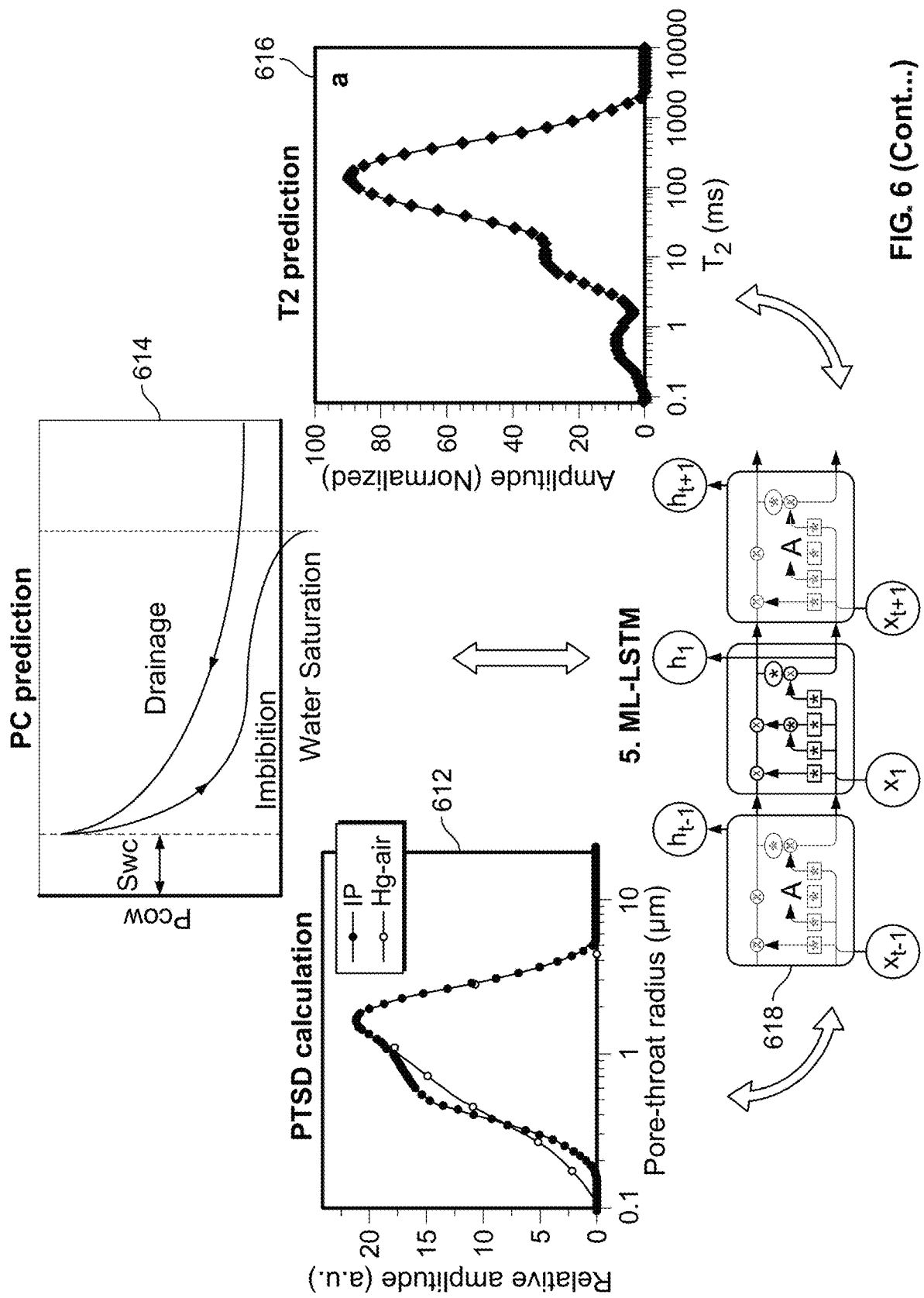
FIG. 6 (Cont...)

DETERMINING RESERVOIR FORMATION PROPERTIES

TECHNICAL FIELD

The present disclosure describes systems and methods for determining reservoir formation properties and, more particularly, systems and methods for determining pore throat size distribution and capillary pressure curves with, in part, nuclear magnetic resonance (NMR) logs using one or more machine learning models.

BACKGROUND

Nuclear magnetic resonance (NMR) tools, such as wireline tools or other NMR downhole tools, is a wellbore logging technology that can be used for exploration and reservoir characterization in the oil and gas industry. NMR logging is an imaging technology that can be applied while drilling within the wellbore to provide various spatially continuous measurements, such as formation porosity, permeability, water, and hydrocarbon distributions. NMR can produce measurable signals in the form of relaxation times that reflect the decay of the motion of hydrogen nuclei in the water and hydrocarbons within the pore-volume of the rock. The NMR relaxation times respond to the number of hydrogen atoms within and characteristics of the rock. The interpreted relaxation times can, therefore, provide estimates of the porosity, water saturation, and indirectly, the permeability of the reservoir.

SUMMARY

According to the present disclosure, an example implementation for determining one or more reservoir formation properties includes generating, with one or more hardware processors, a plurality of digital models of a plurality of core samples taken from one or more reservoir formations based on a corresponding plurality of images of the plurality of core samples; determining, with the one or more hardware processors, a pore throat size distribution of the plurality of core samples based on the generated digital models; determining, with the one or more hardware processors, corresponding capillary pressure curves and corresponding NMR value distributions of the plurality of core samples with one or more numerical simulations; generating, with the one or more hardware processors, one or more machine-learning (ML) models based on the pore throat size distribution, corresponding capillary pressure curves, and corresponding NMR value distributions of the plurality of core samples; adjusting, with the one or more hardware processors, the one or more ML models with one or more reservoir data of the one or more reservoir formations; generating, with the one or more hardware processors, adjusted capillary pressure curves and NMR value distributions from the one or more adjusted ML models; and determining, with the one or more hardware processors, a reservoir formation specific pore throat size distribution from at least one of the adjusted capillary pressure curves or the adjusted NMR value distributions.

Example implementations for determining one or more reservoir formation properties according to the present disclosure can be embodied in computer-implemented methods, computing systems, and computer-readable media. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

An aspect combinable with the example implementation further includes validating, with the one or more hardware processors, the corresponding capillary pressure curves and corresponding NMR value distributions with a plurality of NMR value measurements and capillary pressure measurements taken of the plurality of core sample.

In another aspect combinable with any of the previous aspects, the NMR value distributions include NMR T2 value distributions, and the NMR value measurements include NMR T2 value measurements.

In another aspect combinable with any of the previous aspects, the corresponding capillary pressure curves are determined with one or both of a Navier-Stokes simulation or a Lattice-Boltzman simulation.

In another aspect combinable with any of the previous aspects, the corresponding NMR value distributions are determined with one or more of a finite difference simulation, a finite element simulation, or a Random-Walk simulation.

In another aspect combinable with any of the previous aspects, the one or more ML models includes one or more Long-Short-Time-Memory ML models.

In another aspect combinable with any of the previous aspects, adjusting the one or more ML models with one or more reservoir data of the one or more reservoir formations includes performing, with the one or more hardware processors, a diffusion coupling assessment for each of the one or more reservoir formations; normalizing, with the one or more hardware processors, the plurality of NMR value measurements with an NMR log data translation process for a plurality of varying operating conditions; and determining, with the one or more hardware processors, the reservoir formation specific pore throat size distribution from a particular normalized NMR value distribution for a particular reservoir formation of the one or more reservoir formations.

Another aspect combinable with any of the previous aspects further includes generating, with the one or more hardware processors, a petrophysical rock type from the reservoir formation specific pore throat size distribution.

Another aspect combinable with any of the previous aspects further includes validating, with the one or more hardware processors, the reservoir formation specific pore throat size distribution with one or more predicted reservoir formation specific pore throat size distributions.

Another aspect combinable with any of the previous aspects further includes generating, with the one or more hardware processors, data to generate a graphical representation of at least one of the reservoir formation specific pore throat size distribution, the adjusted capillary pressure curves, or NMR value distributions on a graphical user interface (GUI).

In another aspect combinable with any of the previous aspects, the corresponding plurality of images include at least one of x-ray or microtomography images.

Implementations of systems and methods for determining reservoir formation properties according to the present disclosure can include one, some, or all of the following features. For example, implementations of the present disclosure can better estimate a residual oil saturation, irreducible water saturation, relative permeability, and reservoir model initialization. As another example, implementations of the present disclosure can enhance a reliability of nuclear magnetic resonance (NMR) measurements to provide an unprecedented understanding of static and dynamic reservoir properties, enable the unlocking of new resources, and optimize field development by providing valuable data for reservoir characterization and modeling. As a further example, implementations of the present disclosure can provide a robust, low cost, and accurate approach for calibrating an NMR response and predicting pore throat size distribution and capillary pressure curves from NMR $T_2$ logs for any reservoir of interest in order to enhance petrophysical rock typing. Implementations of the present disclosure can also provide a comprehensive lab-to-field upscaling workflow for determining reservoir formation properties, which is essential to reservoir characterization and modeling.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

The present disclosure describes example implementations of computer-implemented systems, methods, and apparatus, as well as workflows, for determining one or more reservoir formation characteristics of a hydrocarbon-bearing subterranean formation. In some aspects, such techniques and workflows use one or more formation or rock sample measurements in combination with numerical simulations and one or more machine-learning (ML) models to determine the one or more reservoir formation characteristics. In some aspects, example implementations according to the present disclosure generate or use ML technology to advance an interpretation of nuclear magnetic resonance (NMR) logging to estimate pore throat size distribution and capillary pressure curves to, for example, better estimate a residual oil saturation, irreducible water saturation, relative permeability, and reservoir model initialization. In some aspects, NMR measurements (lab or wellbore or both) can provide an improved understanding of static and dynamic reservoir properties, enable unlocking new resources, and optimize field development by providing data for reservoir characterization and modeling.

In some aspects, the described implementations include a multi-phase workflow that includes laboratory phase data and field (for example, wellbore) phase data. For example, the laboratory phase data can include imaging of core samples (as well as other core sample testing), and predicting pore throat size distribution (PTSD) and capillary pressure curves (Pc curves) in combination with an ML model. The field phase data can include NMR log data, such as NMR $T_2$ log data, and predicting PTSD and Pc curves by updating the ML model.

Figure 1A:
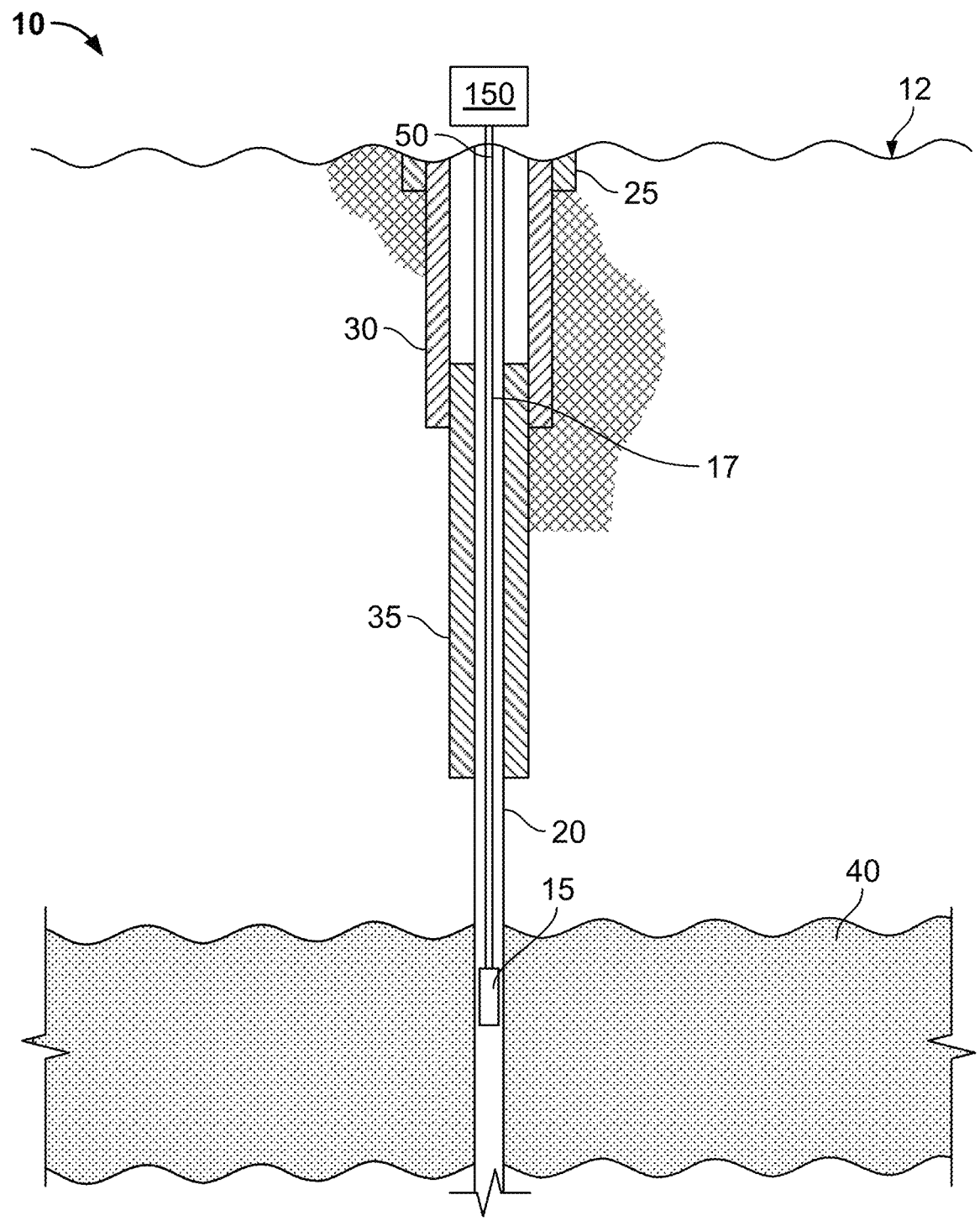
FIG. 1A is a schematic drawing of an NMR logging system that can provide NMR measurements of a subterranean formation for a machine learning model according to the present disclosure.
Figure 1B:
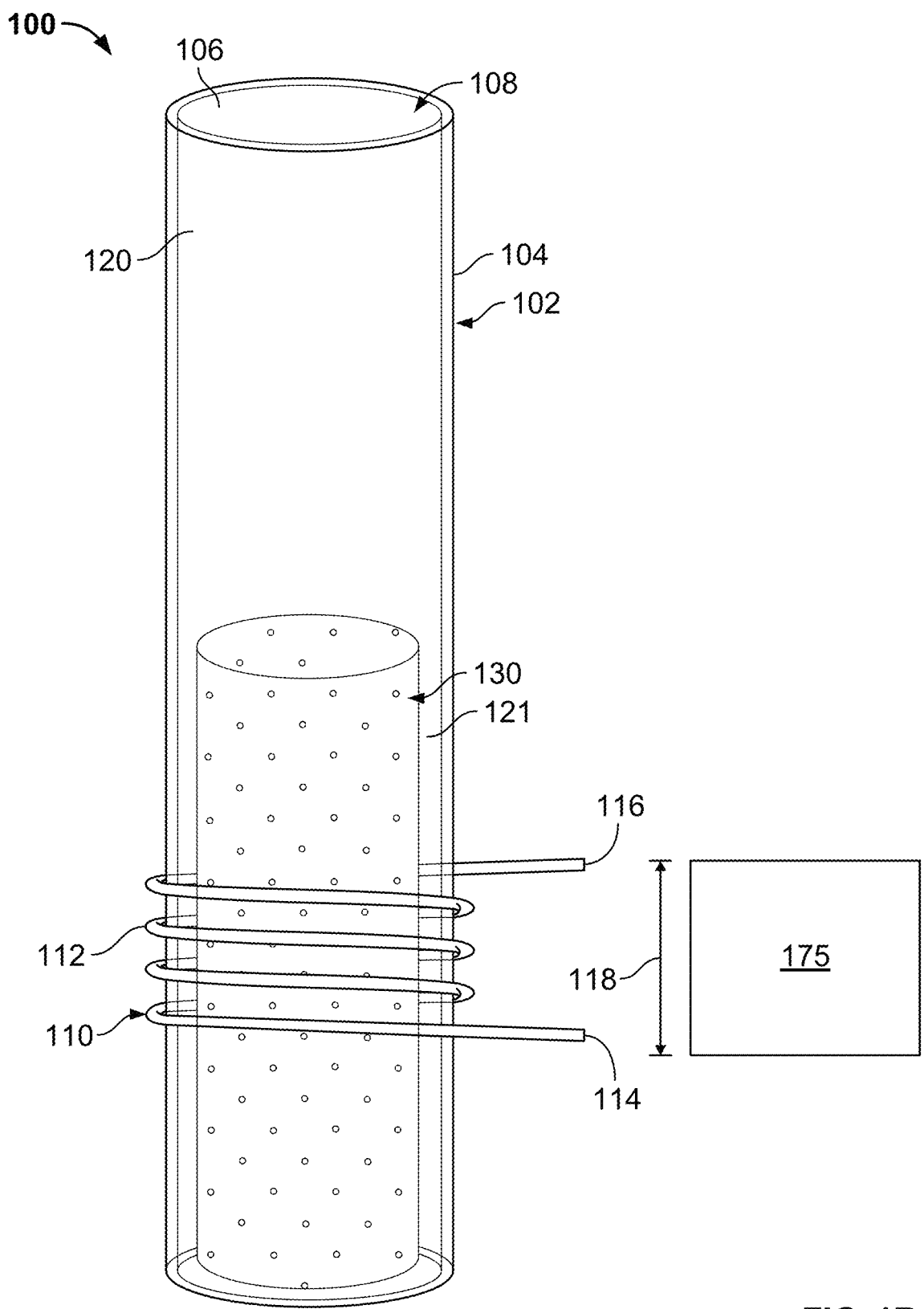
FIG. 1B is a schematic drawing of an NMR test system that can provide NMR measurements of a core sample to validate a machine learning model according to the present disclosure.
Figure 2:
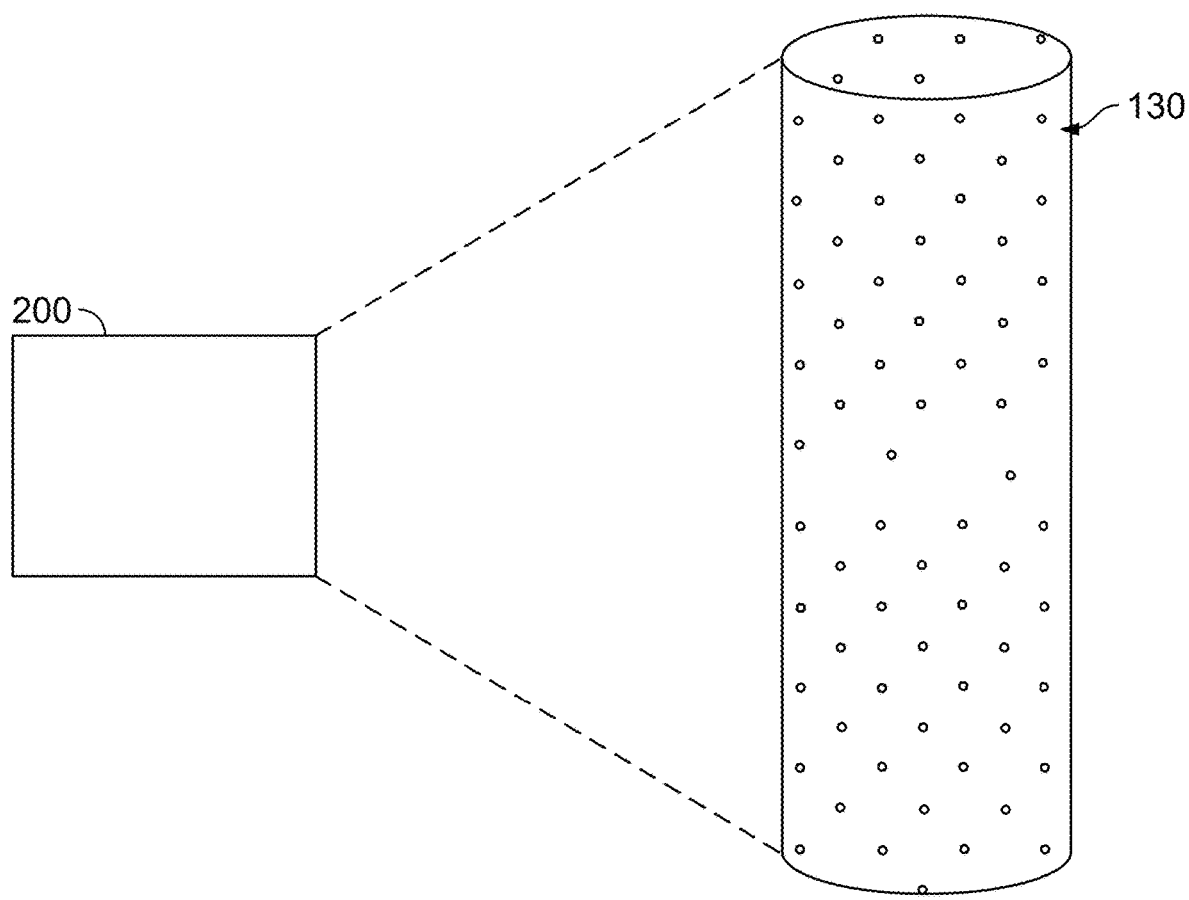
FIG. 2 is a schematic drawing of a core sample imaging system that can provide core images for a machine learning model according to the present disclosure.
Figure 4:
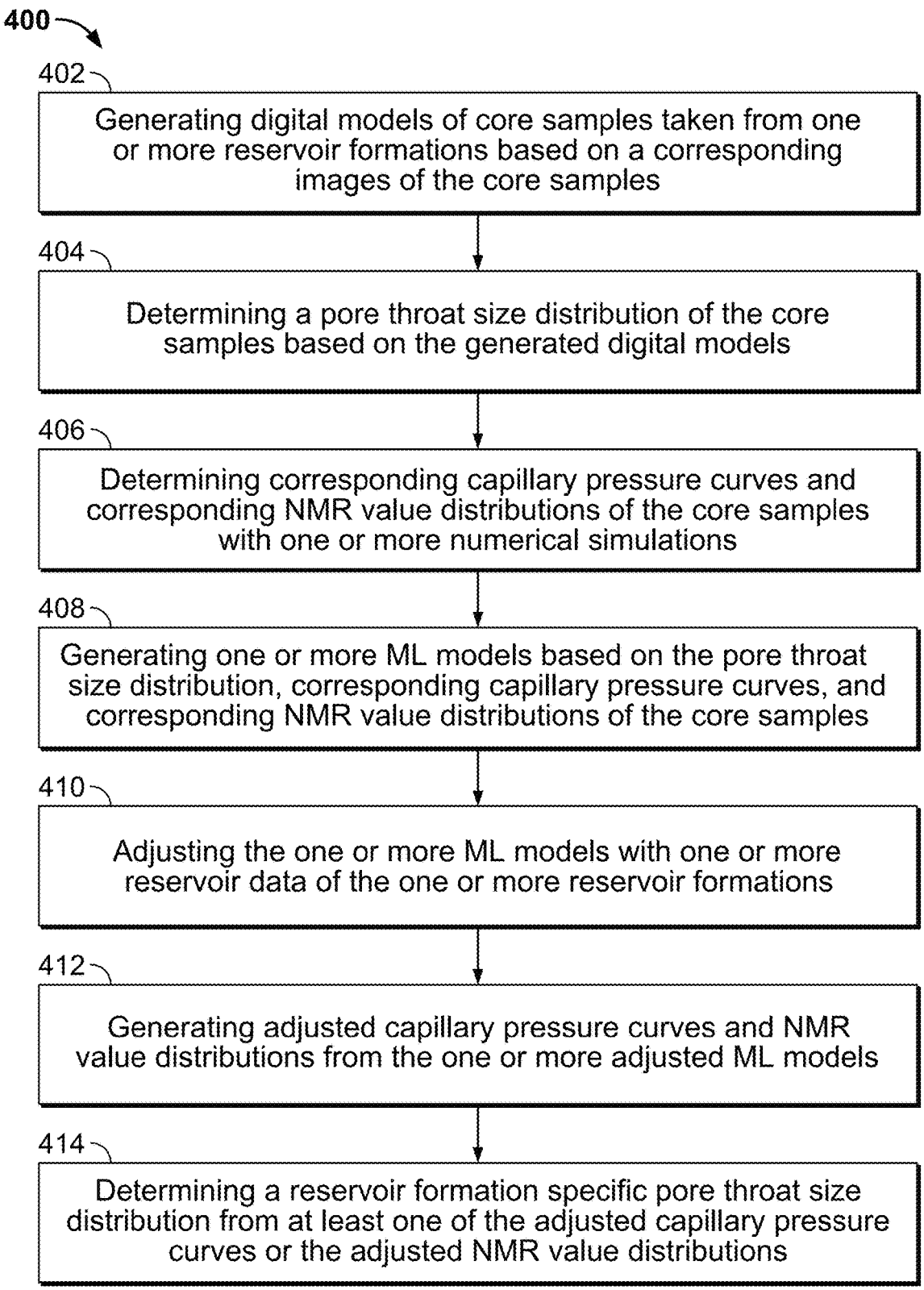
FIG. 4 is a flowchart that describes an example implementation of a method for determining pore throat size distribution and capillary pressure curves with NMR logs and core images using one or more machine learning models according to the present disclosure.

FIGS. 1A, 1B, and 2 illustrate data collection processes that can be used (all or in part) to implement a method 400 shown in the flowchart of FIG. 4 for determining pore throat size distribution and capillary pressure curves with NMR logs and core images using one or more machine learning models according to the present disclosure. For example, FIG. 1A (described in more detail herein) describes an NMR logging process to obtain NMR measurements of a reservoir formation (in the field measurements). FIG. 1B (described in more detail herein) describes an NMR testing process to obtain NMR measurements of core samples (in the lab measurements). FIG. 2 (described in more detail herein) describes a core sample imaging process to obtain images, for example, x-ray, microtomography, scanning electron microscope, or otherwise (in the lab measurements).

Figure 3:
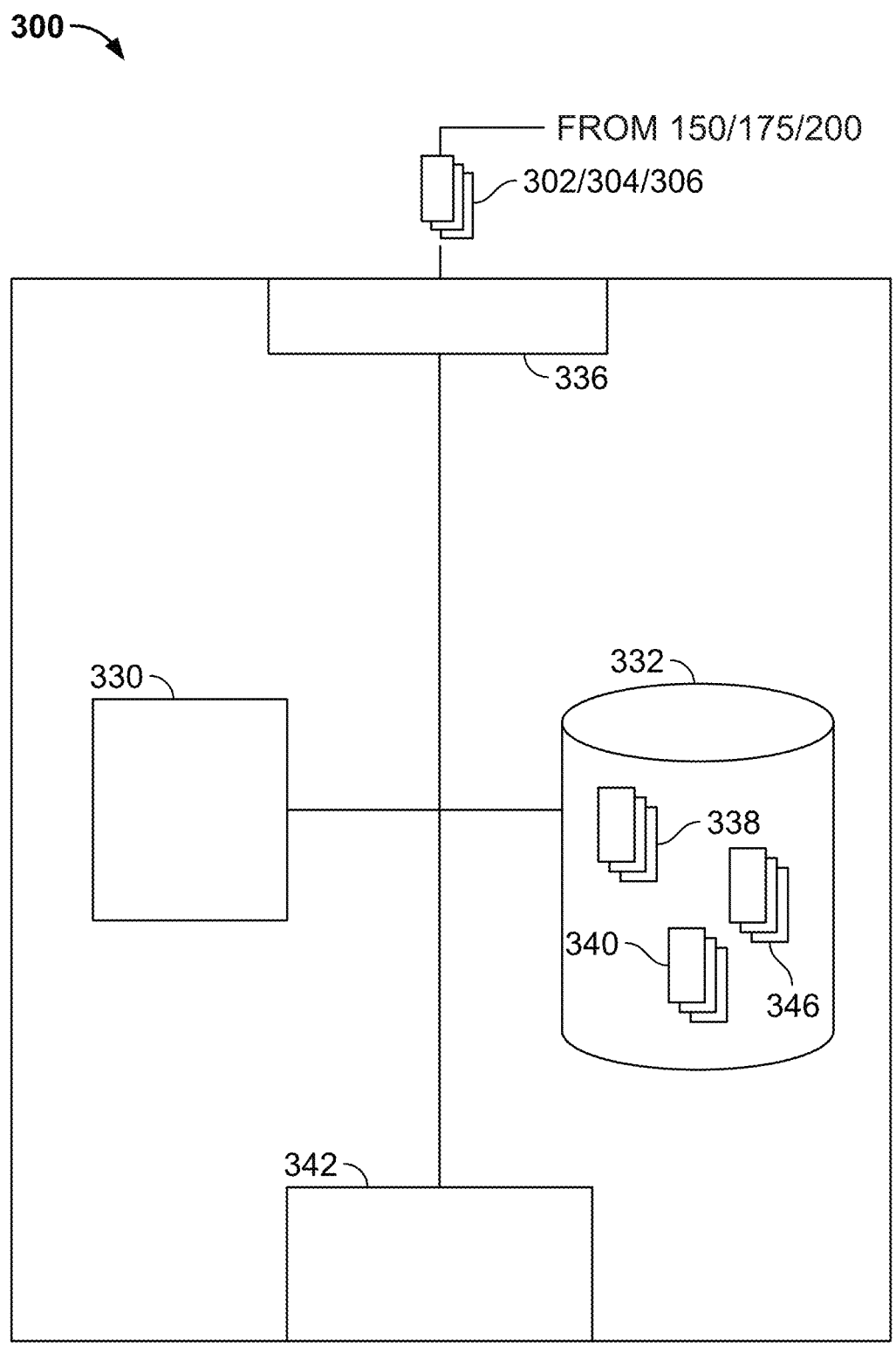
FIG. 3 is an example diagram of a computing system used to provide NMR measurements and core images and/or other data according to the present disclosure.

FIG. 3 shows an example computing system 300 that can be used to receive, store, and/or process data from the measurement systems in FIGS. 1A-1B and 2 (and/or other measurement systems) to perform one or more of the steps of the example method 400. More specifically, computing system 300 is or implements a reservoir formation modeling system 300 (structured data processing system) that is a processor-based control system operable to implement one or more operations described in the present disclosure. As shown in FIG. 3, reservoir NMR values 302 from an NMR control system 150 (shown in FIG. 1A for field measurements), core sample NMR values 304 from an NMR control system 175 (shown in FIG. 1B for lab measurements), and core sample images 306 (from imaging device 200 shown in FIG. 2) can be received at the reservoir formation modeling system 300.

The reservoir formation modeling system 300 may be any computing device operable to receive, transmit, process, and store any appropriate data associated with operations described in the present disclosure. The illustrated reservoir formation modeling system 300 includes reservoir formation modeling application 330. The application 330 is any type of application that allows a user or other system to request and view content on the reservoir formation modeling system 300. In some implementations, the application 330 can be and/or include a web browser. In some implementations, the application 330 can use parameters, metadata, and other information received at launch to access a particular set of data associated with the reservoir formation modeling system 300. Further, although illustrated as a single application 330, the application 330 may be implemented as multiple applications in the reservoir formation modeling system 300.

The illustrated reservoir formation modeling system 300 further includes an interface 336, a processor 342, and a memory 332. The interface 336 is used by the reservoir formation modeling system 300 for communicating with other systems in a distributed environment—including, for example, one, some, or both of the NMR control system 150, the NMR control system 175, or the core sample imaging device 200—that may be connected to a network. Generally, the interface 336 comprises logic encoded in software and/or hardware in a suitable combination and operable to communicate with a network, and/or other computing devices. More specifically, the interface 336 may comprise software supporting one or more communication protocols associated with communications such that a network or interface's hardware is operable to communicate physical signals within and outside of the reservoir formation modeling system 300.

Regardless of the particular implementation, "software" may include computer-readable instructions, firmware, wired or programmed hardware, or any combination thereof on a tangible medium (transitory or non-transitory, as appropriate) operable when executed to perform at least the processes and operations described herein. Indeed, each software component may be fully or partially written or described in any appropriate computer language including C, C++, Java, Visual Basic, ABAP, assembler, Perl, Python, .NET, Matlab, any suitable version of 4GL, as well as others. While portions of the software illustrated in FIG. 3 are shown as individual modules that implement the various features and functionality through various objects, methods, or other processes, the software may instead include a number of sub-modules, third party services, components, libraries, and such, as appropriate. Conversely, the features and functionality of various components can be combined into single components as appropriate.

The processor 342 executes instructions and manipulates data to perform the operations of the reservoir formation modeling system 300. The processor 342 may be a central processing unit (CPU), a blade, an application specific integrated circuit (ASIC), a field-programmable gate array (FPGA), graphics processing unit (GPU), or another suitable component. Generally, the processor 342 executes instructions and manipulates data to perform the operations of the reservoir formation modeling system 300.

Although illustrated as a single memory 332 in FIG. 3, two or more memories may be used according to particular needs, desires, or particular implementations of the reservoir formation modeling system 300. In some implementations, the memory 332 is an in-memory database. While memory 332 is illustrated as an integral component of the reservoir formation modeling system 300, in some implementations, the memory 332 can be external to the reservoir formation modeling system 300. The memory 332 may include any memory or database module and may take the form of volatile or non-volatile memory including, without limitation, magnetic media, optical media, random access memory (RAM), read-only memory (ROM), removable media, or any other suitable local or remote memory component. The memory 332 may store various objects or data, including classes, frameworks, applications, backup data, business objects, jobs, web pages, web page templates, database tables, repositories storing business and/or dynamic information, and any other appropriate information including any parameters, variables, algorithms, instructions, rules, constraints, or references thereto associated with the purposes of the reservoir formation modeling system 300. As illustrated in FIG. 3, the memory 332 stores structured or unstructured (e.g. raw text files with no predefined taxonomy) data, one or more ML models 338, measured or estimated reservoir characteristics 340 (for example, $P_c$ curves and NMR values estimated by one or more numerical solutions), and PTSD values 340.

The illustrated reservoir formation modeling system 300 is intended to encompass any computing device such as a desktop computer, laptop/notebook computer, wireless data port, smart phone, smart watch, wearable computing device, personal data assistant (PDA), tablet computing device, one or more processors within these devices, or any other suitable processing device. For example, the reservoir formation modeling system 300 may comprise a computer that includes an input device, such as a keypad, touch screen, or other device that can accept user information, and an output device that conveys information associated with the operation of the reservoir formation modeling system 300 itself, including digital data, visual information, or a GUI.

Turning briefly to FIG. 1A, this figure illustrates an example well system 10, which includes an NMR logging tool 15 to generate an NMR log of one or more reservoir formations 40 (for example, carbonate, shale, sandstone, or otherwise) during a field phase of the workflow described in the present disclosure. The generated NMR log measurements (as part of characteristics 340) can be provided through the NMR control system 150 to the reservoir formation modeling system 300 prior to or during execution of method 400. In this example, as shown, the well system 10 includes a wellbore 20 that is formed (for example, drilled) from a terranean surface 12 (whether on land or under a body of water) through multiple geologic formations (represented as 40) (also referred to as reservoirs or subterranean zones). The wellbore 20, although shown as vertical, can be directional, horizontal, slanted, or lateral or a combination thereof. The NMR logging tool 15 can extend and be moved (run into or out of the wellbore 20) on a downhole conveyance 17 (for example, wireline or otherwise) from a downhole conveyance system 50. In some aspects, as shown, one or more casings 25, 30 and/or 35 can be installed (for example, cemented into) the wellbore 20. In some aspects, all or a part of the wellbore 20 can be open hole.

The NMR logging tool 15 can record multiple parameters indicative of the geologic formations 40 during a logging operation through an entire length or depth of the wellbore 20. For example, NMR logging tool 15 may operate to measure an induced magnet moment of hydrogen nuclei contained within the fluid-filled pore space of the geologic formations 40. The NMR logging tool 15 may respond to the volume, composition, viscosity, and distribution of fluids, for example, oil, gas, and water, in the geologic formations 40. The NMR logging tool 15 may record information about the quantities of such fluids present, the properties of these fluids, and the sizes of the pores in the formations 40 that contain these fluids. Thus, the NMR logging tool 15 may record or estimate volume (porosity) and distribution (permeability) of the rock pore space, rock composition, type and quantity of fluid hydrocarbons, and hydrocarbon producibility. The NMR logging tool 15 also records $T_1$ relaxation (longitudinal relaxation time in seconds) and $T_2$ relaxation (transverse relaxation time in seconds). The logged NMR values (such as $T_2$ values) can be provided as part of the measured reservoir characteristics 304.

Turning briefly to FIG. 1B, this figure illustrates an example test system 100, which includes an NMR pressure test cell 102 that generates NMR value measurements of a core sample 130 (or multiple core samples), such as carbonates, shales, sandstone, or otherwise, during a lab phase of the workflow described in the present disclosure. For example, test system 100 uses nuclear magnetic resonance (NMR) measurements to directly measure nuclei in core sample 130 (which can represent a solid core sample, crushed pieces of a core sample, or drill cuttings). The test system 100 includes the test container 102 (also called a test cylinder or NMR pressure test cell) that is comprised of a cylinder 104 that defines an inner volume 106 into which the core sample 130 can be inserted (for example, through an open end). The cylinder 104 has a particular radius of the inner volume 106 (as well as a height) that is sufficient to hold a core sample of a particular size.

As further shown in FIG. 1B, an NMR coil 110 is positioned around the cylinder 104 (or conversely, the cylinder 104 is positioned within loops 112 of the NMR coil 110). Thus, in this example, the combination of the test container 102 and NMR coil 110 comprises an NMR pressure cell 102. The NMR coil 110 includes contacts 114 and 116 that are separated by a length (or height) 118, which is a distance of a sensitive zone of detection of the NMR coil 110. While the NMR pressure cell 102 in this example includes the cylinder 104, other container shapes (and core sample shapes) can be used without departing from the scope of this disclosure.

Test system 100 can be used in the collection of NMR spectra with parameters related to the core sample 130. An NMR control system 175 is communicably coupled to the NMR coil 110 in order to operate the coil 110 and collect NMR spectra (for example, $T_2$ values or otherwise) to provide to the reservoir formation modeling system 300.

Turning briefly to FIG. 2, this figure shows a core sample imaging device 200 that generates images of the core sample 130 (or multiple core samples) during a lab phase of the workflow described in the present disclosure. The core sample imaging device 200 can take, for example, x-ray, microtomography, scanning electron microscope, and/or other images showing, for instance, pore-level views of the structure of core sample 130.

Figure 10:
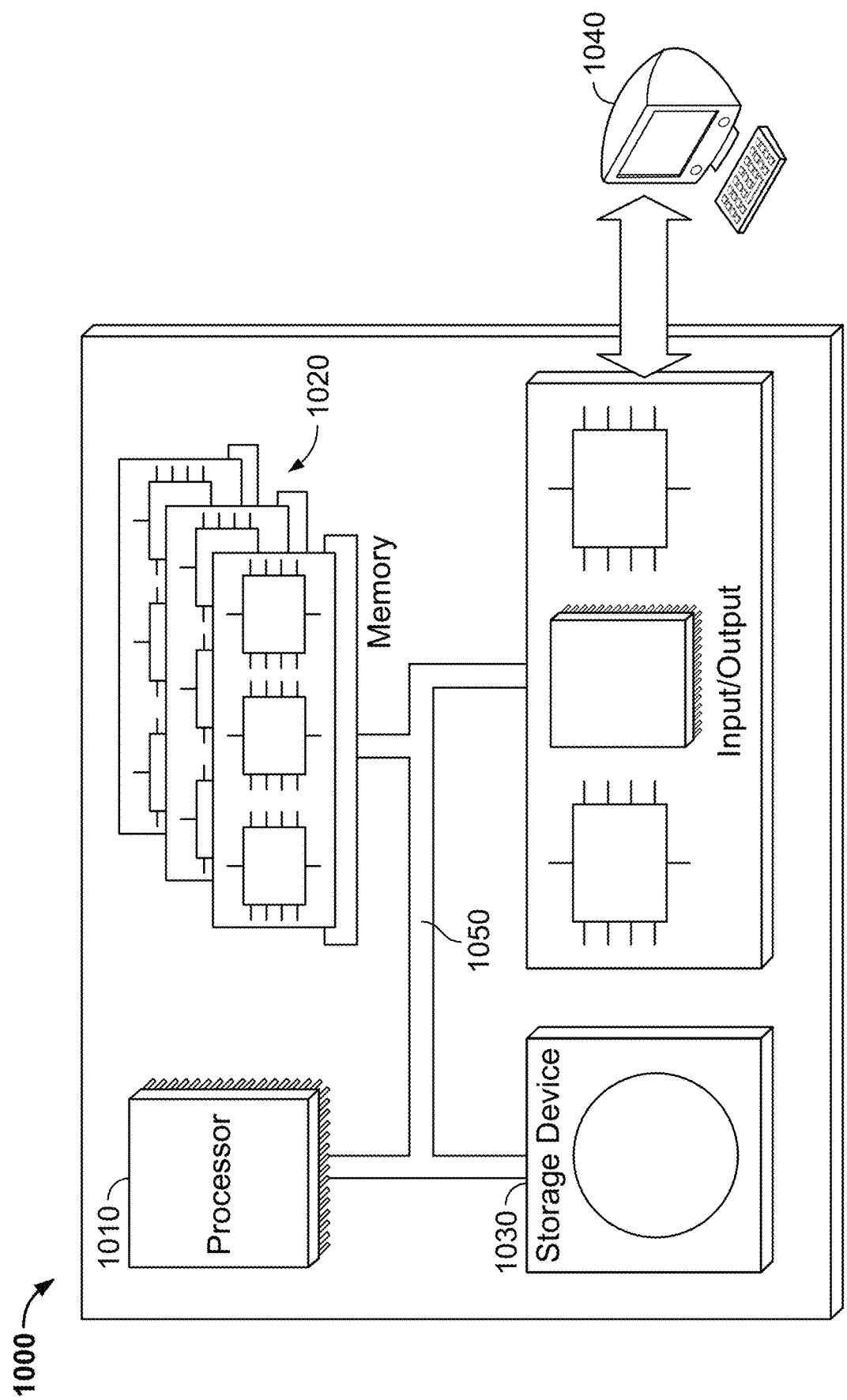
FIG. 10 shows a schematic drawing of a control system that can be used in the example method of FIG. 4 (in whole or part) for determining pore throat size distribution and capillary pressure curves with NMR logs and core images using one or more machine learning models according to the present disclosure.

Method 400 can be implemented by or with (all or in part) the reservoir formation modeling system 300 (with or as the control system 1000 described in FIG. 10). Method 400 can begin at step 402, which includes generating digital models of core samples taken from one or more reservoir formations based on a corresponding images of the core samples. For example, using core sample imaging device 200, images of core samples 130 can be taken and, in some aspects, stored for use in step 402. Thus, the core samples (and images thereof) in step 402 can be historical images of core samples 130, as well as real-time images of core sample 130 (in other words, obtained as part of executing step 402. Once obtained, collected, or identified, the images of core samples 130 can be digitized so that each core sample 130 can be associated with a corresponding digital model.

Figure 5:
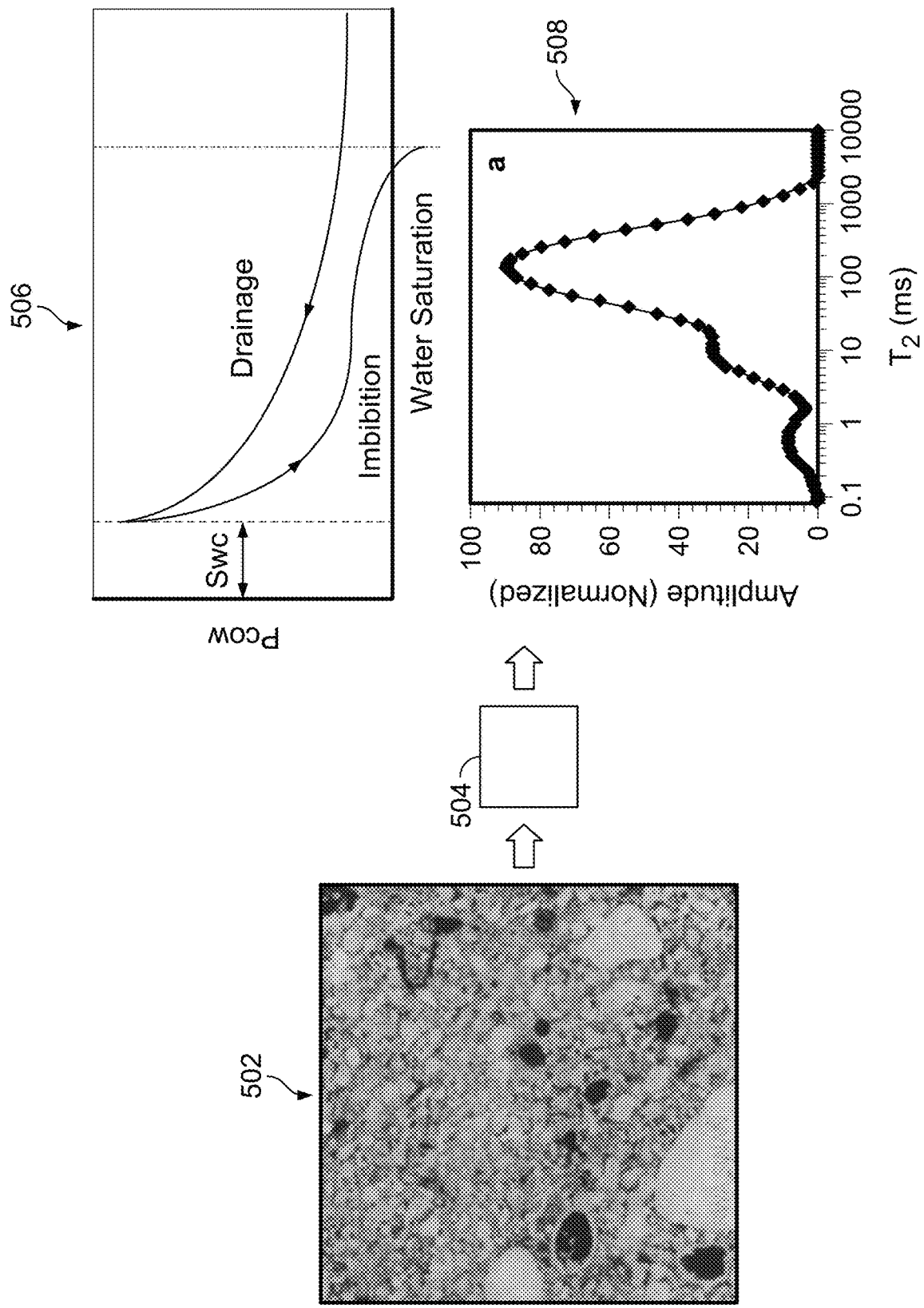
FIG. 5 is a schematic drawing that shows a portion of an example workflow for determining pore throat size distribution and capillary pressure curves with NMR logs and core images using one or more machine learning models according to the present disclosure.
Figure 6:
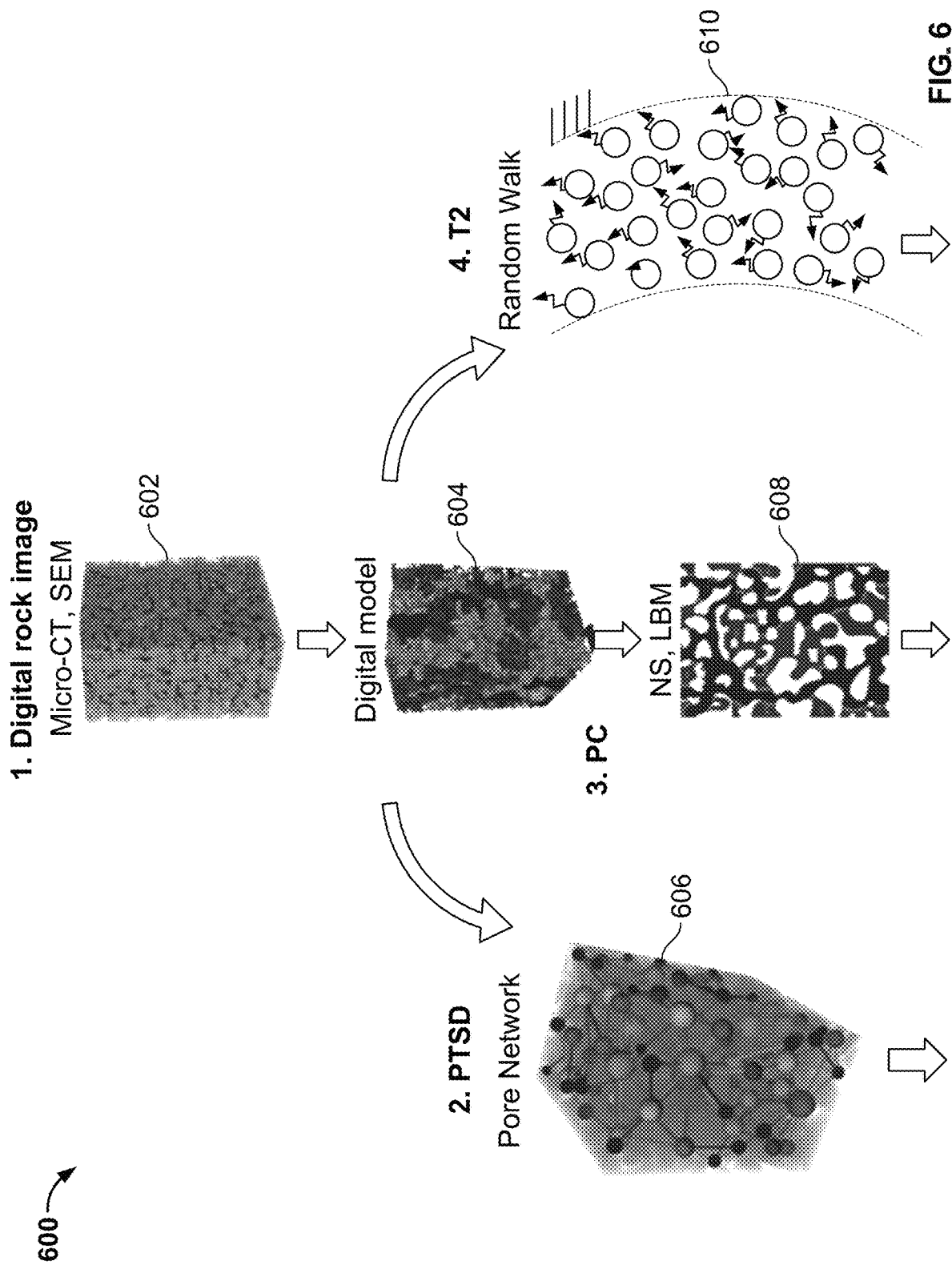
FIG. 6 is a schematic drawing that shows a more detailed example of the portion of the workflow shown in FIG. 5 according to the present disclosure.

Turning briefly to FIG. 5, for instance, an example image 502 is shown as part of an ML process (described in more detail herein). Turning also to FIG. 6, an example workflow 600 is shown that includes, among other steps, step 402. For example, as shown, images 602 are obtained and processed into digital models 604 (for example, an independent digital model for each image). In some aspects, a digital model can be constructed by grouping multiple, high-resolution two-dimensional thin sections using statistical methods and process-based algorithms. Afterward, a pore network model can be extracted from a digital model (which can be created by, among other software packages, open source software).

Step 402 can also include additional lab phase processes along with the generation of digital models 604 (and, in some cases, capture of images 602). For example, NMR value measurements (such as $T_2$) can be taken (such as by NMR test system 100), as well as capillary pressure curves, of core samples 130.

Method 400 can continue at step 404, which includes determining a pore throat size distribution of the plurality of core samples based on the generated digital models. For example, once digital models 604 of the core samples (from images 602) are generated, a pore throat size distribution (across the images 602 and thus across the core samples 130) can be generated. In some aspects, the pre throat size of a particular core sample 130 can refer to a radius of a circle drawn perpendicular to fluid flow and fitting within a narrowest point of a pore in a rock sample. In some aspects, absolute size of a pore is a radius of a largest sphere that will fit inside the pore. In some aspects, the PTSD can be determined by building a three-dimensional equivalent pore-network from the digital models 604.

An example three-dimensional equivalent pore-network 606 is shown in workflow 600 and is generated by digital models 604 (for example, an independent network 606 for each digital model 604). As shown in FIG. 6, the pore-network 606 is represented by different spheres and tubes. Here, spheres represent the pore body and tubes represent the pore throat. The PTSD can be calculated by grouping all tubes with different radii from the pore-network 606.

Method 400 can continue at step 406, which includes determining corresponding capillary pressure curves and corresponding NMR value distributions of the core samples with one or more numerical simulations. For example, in some aspects, numerical simulations, such as Navier-Stokes (NS), Lattice-Boltzman (LBM), or both, can be used to calculate $P_c$ curves for the core samples 130. Referring to the workflow 600, numerical simulations 608 can be used on the digital models 604 to generate independent $P_c$ curves (for example, one for each model 604).

In some aspects, numerical simulations, such as Random-Walk, can be used to calculate NMR $T_2$-distributions for the core samples 130. In some aspects, therefore, step 406 can also be used as a validation of lab taken NMR measurements by the test system 100 on core samples 130. Referring to the workflow 600, numerical simulations 610 (Random-Walk and/or others, such as finite element or finite difference) can be used on the digital models 604 to generate NMR $T_2$-distributions (for example, one for each model 604).

As an example of the Random-Walk simulation 610, this simulation can begin with a number of protons, which can be located randomly in the pore space of the core sample 130. A nearest distance between the protons and the solid walls of the sample 130 is recorded, which can be used to determine a diffusion radius. The positions of the protons in the next moment are updated. Next, collisions of the solid walls of the sample 130 with the protons are checked and the resulting behavior is determined. Such behavior can include killing the proton or bouncing off the wall, based on a given probability. The previous sequence of events is then repeated.

Method 400 can continue at step 408, which includes generating one or more ML (machine-learning) models based on the pore throat size distribution, corresponding capillary pressure curves, and corresponding NMR value distributions of the core samples. For example, one or more ML (or deep neural network, or DNN) models can be generated, and in some aspects, trained, using the PTSD, $P_c$ curves, and $T_2$ data generated in or with steps 402-408. In some aspects, the ML model is a Long Short-Term Memory (LSTM) model, which can be advantageous for temporal modeling and sequenced data. In some cases, the ML model(s) can be a combination of a DNN and LSTM models, which have the advantage of improving machine accuracy and accelerating a training process. As shown in the workflow 600, the calculated PTSD 612 and numerically simulated $P_c$ curves 614 and $T_2$ data 616 can be fed into one or more ML models 618, which is/are trained with such data. In some aspects, ML model(s) 618 can map a non-linear relationship between PTSD and $T_2$, as well as a non-linear relationship between capillary pressure and $T_2$.

In some aspects, there can be three ML models 618. For example, a first ML model 618 can map a relationship between pore throat size and capillary pressure. A second ML model 618 can map a relationship between pore throat size and NMR data. A third ML model 618 can map a relationship between capillary pressure and NMR data.

In some aspects, steps 402-408 comprise a lab phase of method 400. With reference to FIG. 5, therefore, the lab phase can include the input of the images 502 to ultimately generate and train (along with the numerically simulated $P_c$ curves and $T_2$ data) one or more ML models 504. Once trained, the ML model(s) 504 can output (given an input of the images 502), estimated $P_c$ curves 506 and $T_2$ NMR values 508 for a particular rock type.

Method 400 can continue at step 410, which includes adjusting the one or more ML models with one or more reservoir data of the one or more reservoir formations. For example, reservoir data can be, among other data, NMR logging data, geologic data (rock type or otherwise), as well as operating conditions during which the NMR logging data was obtained by a NMR logging tool. For example, NMR logging data can be taken with the well system 10 (prior to or along with step 410).

Figure 8:
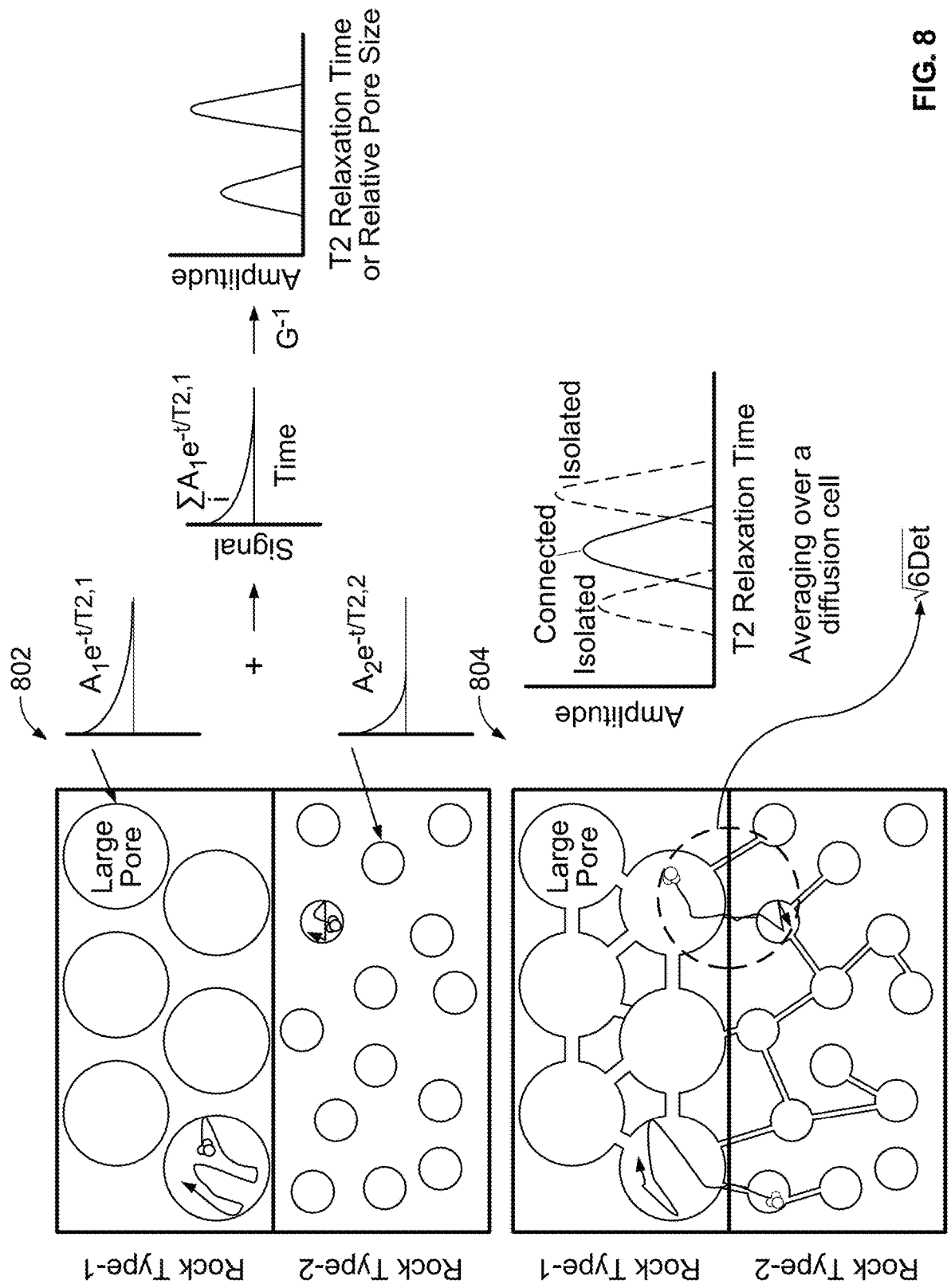
FIG. 8 is a schematic drawing that shows a more detailed example of the portion of the workflow shown in FIG. 7 according to the present disclosure.

In some aspects, step 410 can also include sub-steps. For example, in a first sub-step, a diffusion coupling assessment for the particular reservoir formation 40 (in FIG. 1A) can be performed. For example, in dual-porosity-like (primary and secondary) systems, such as carbonate rocks or thin-bedded rocks, the NMR values can exhibit a complex response as a result of diffusion coupling. Diffusion coupling can be shown with reference to FIG. 8. In FIG. 8, a simple model of isolated pores is shown in graphic 802, along with the associated $T_2$ relation time response. However, in interbed diffusion coupling, shown in graphic 804, the more complex $T_2$ response is shown. The complexity of these petrophysical properties is in their dependency on many properties including the pore structure, the fluid-rock interaction, and the rock mineralogy. For instance, carbonate rocks typically exhibit multiple porosity systems, primary and secondary, which include pore-bodies and pore-throats that cannot be separately measured with NMR, and therefore can require further signal calibration. In some aspects, such as with Random Walk simulations, the interaction between the primary and secondary porous systems can be activated or deactivated, and therefore the effect of diffusion coupling can be assessed. The capability to evaluate the NMR response, the pore-throat size distribution, capillary pressure, and relative permeability can provide various functionalities to enhance petrophysical rock typing.

Diffusion coupling can be evaluated theoretically, experimentally or a combination of the two using ideal porous models. For example, a diffusion coupling parameter can be developed to determine the degree of coupling in sandstone and grainstones in terms of pore geometry. Effect of surface mineralogy on diffusion coupling can be determined experimentally (for example, through experimental study on silica gels porous media containing Fe 3+. Other studies include diffusion coupling in carbonates containing micro- and macro-pores, in which micro- and macro-porosity contributions can be separated when magnetization decay in macropores is much longer than in micropores were able to separate. The relaxation decay can be represented by a bi-exponential decay.

As another sub-step, the NMR logging data can be normalized by implementing an NMR log data translation method for various operation conditions. The operating conditions include, for example, types of drilling muds, a mud filtrate invasion profile determined by rock quality (permeability), types of reservoir fluids in the NMR logging depth, and wettability. In some aspects, this sub-step can provide for a normalized comparison of $T_2$ data and NMR logs across the same reservoir at different times in the drilling/fluid invasion process. An example normalization method includes the NMR $T_2$ Fluids Substitution Method, in which the hydrocarbon response is replaced by a water response. A water-filled response provides corrected pore size distribution and enhanced reservoir rock quality evaluation.

Figure 9:
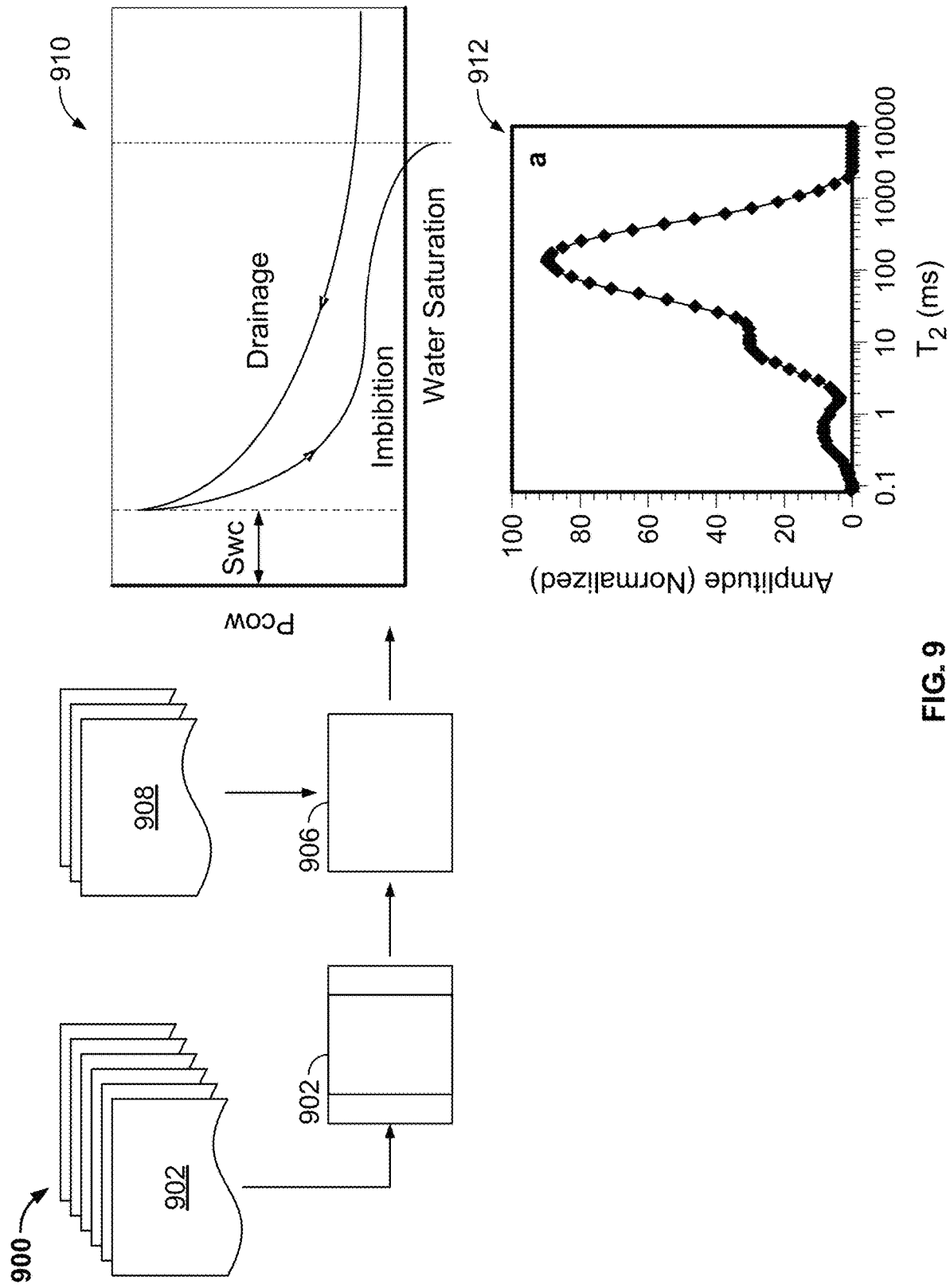
FIG. 9 is a schematic drawing that shows another more detailed example of the portion of the workflow shown in FIG. 7 according to the present disclosure.

The ML model(s) generated in step 408 (for example, shown as ML model(s) 504 or 618) is fine-tuned or adjusted as part of step 410 with the aforementioned data from the reservoir formation 40. For example, an ML model can be fine-tuned through the process of transfer learning, in which a particular ML model 618 is reused on a new related task in a field phase of the workflow of method 400. In transfer learning, a machine exploits the knowledge gained from a previous task to improve generalization about another. This ensures a faster learning process, more accurate, and requiring less training data. Turning briefly to FIG. 9, a workflow 900 is shown that describes steps 408 through 412. For example, workflow 900 includes the core sample images 902 that are used to ultimately generate and train one or more ML models 904 (model(s) 504 or 618). Reservoir data 908 (from a reservoir of interest such as reservoir formation 40) is then used to generate an adjusted ML model(s) 906.

Method 400 can continue at step 412, which includes generating adjusted capillary pressure curves and NMR value distributions from the adjusted ML model(s). For example, once the ML model(s) 504 or 618 is/are adjusted, $P_c$ curves and NMR $T_2$ data from the model(s) can be output, which correspond to the particular reservoir formation 40. In workflow 900, the adjusted ML model(s) 906 can be used to output $P_c$ curves 910 and $T_2$ NMR 912 for the reservoir of interest.

Method 400 can continue at step 414, which includes determining a reservoir formation specific pore throat size distribution from at least one of the adjusted capillary pressure curves or the adjusted NMR value distributions. For example, from the NMR $T_2$ data 912 from the adjusted ML model 906, a petrophysical rock type dependent PTSD can be predicted. For example, petrophysical rock typing in reservoir characterization can be an input for successful drilling, production, injection, reservoir studies, and simulation. Petrophysical rock typing, in some aspects, means that a set of rocks are classified according to their petrophysical properties, especially properties that pertain to fluid behavior within the rock, such as porosity, capillary pressure, permeabilities, irreducible saturations, and saturations.

Figure 7:
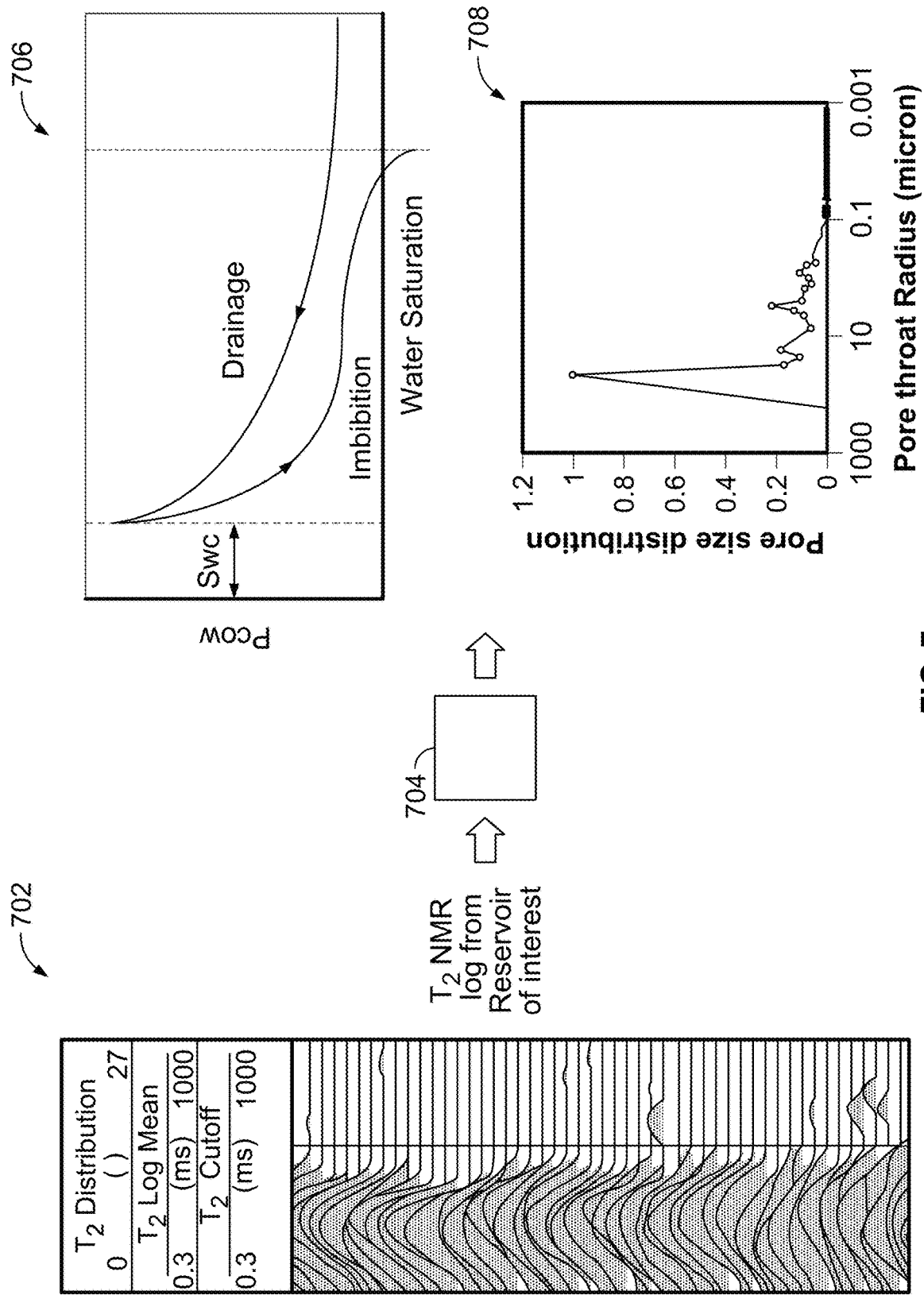
FIG. 7 is a schematic drawing that shows another portion of an example workflow for determining pore throat size distribution and capillary pressure curves with NMR logs and core images using one or more machine learning models according to the present disclosure.

In some aspects, the field phase of the method 400 can be shown in FIG. 7, which shows the reservoir specific data in the form of NMR logs 702, which are used to develop the adjusted ML model 704. The adjusted ML model 704 can then be used (as also described with reference to FIG. 9), to output $P_c$ curves 706 and $T_2$ NMR 708 for the reservoir of interest.

Method 400 can include further steps. For example, predicted $P_c$ curves 706 and $T_2$ NMR 708 from the ML model 704 can be graphically represented on a graphical user interface (such as input/output device 1040). Other data described in the present disclosure can also be graphically represented and presented to a user on a graphical user interface.

As another example, method 400 can include a comparison of the predicted PTSD of the developed petrophysical rock types with predictions from other methods, such as mercury imbibition capillary pressure techniques (MICP), which can be used for measurements of porosity, pore throat size distribution, and injection pressure vs. mercury saturation for many types of rocks.

FIG. 10 is a schematic illustration of an example control system 1000 for a rock property measurement system according to the present disclosure. For example, all or parts of the control system (or controller) 1000 can be used for the operations described previously, for example as or as part of the NMR control systems 150/175 and core sample imaging device 200. The controller 1000 is intended to include various forms of digital computers, such as printed circuit boards (PCB), processors, digital circuitry, or otherwise. Additionally, the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 1000 includes a processor 1010, a memory 1020, a storage device 1030, and an input/output device 1040. Each of the components 1010, 1020, 1030, and 1040 are interconnected using a system bus 1050. The processor 1010 is capable of processing instructions for execution within the controller 1000. The processor may be designed using any of a number of architectures. For example, the processor 1010 may be a CISC (Complex Instruction Set Computers) processor, a RISC (Reduced Instruction Set Computer) processor, or a MISC (Minimal Instruction Set Computer) processor.

In one implementation, the processor 1010 is a single-threaded processor. In another implementation, the processor 1010 is a multi-threaded processor. The processor 1010 is capable of processing instructions stored in the memory 1020 or on the storage device 1030 to display graphical information for a user interface on the input/output device 1040.

The memory 1020 stores information within the control system 1000. In one implementation, the memory 1020 is a computer-readable medium. In one implementation, the memory 1020 is a volatile memory unit. In another implementation, the memory 1020 is a non-volatile memory unit.

The storage device 1030 is capable of providing mass storage for the controller 1000. In one implementation, the storage device 1030 is a computer-readable medium. In various different implementations, the storage device 1030 may be a floppy disk device, a hard disk device, an optical disk device, a tape device, flash memory, a solid state device (SSD), or a combination thereof.

The input/output device 1040 provides input/output operations for the controller 1000. In one implementation, the input/output device 1040 includes a keyboard and/or pointing device. In another implementation, the input/output device 1040 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, solid state drives (SSDs), and flash memory devices; magnetic disks such as internal hard disks and removable disks; magneto-optical disks; and CD-ROM and DVD-ROM disks.

The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) or LED (light-emitting diode) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A computer-implemented method for determining one or more reservoir formation properties, comprising:
generating, with one or more hardware processors, a plurality of digital models of a plurality of core samples taken from one or more reservoir formations based on a corresponding plurality of images of the plurality of core samples;
determining, with the one or more hardware processors, a pore throat size distribution of the plurality of core samples based on the plurality of digital models;
determining, with the one or more hardware processors, corresponding capillary pressure curves and corresponding nuclear magnetic resonance (NMR) value distributions of the plurality of core samples with one or more numerical simulations;
generating, with the one or more hardware processors, one or more machine-learning (ML) models based on the pore throat size distribution, the corresponding capillary pressure curves, and the corresponding NMR value distributions of the plurality of core samples;
adjusting, with the one or more hardware processors, the one or more ML models with one or more reservoir data of the one or more reservoir formations;
generating, with the one or more hardware processors, adjusted capillary pressure curves and adjusted NMR value distributions from the one or more adjusted ML models; and
determining, with the one or more hardware processors, a reservoir formation specific pore throat size distribution from at least one of the adjusted capillary pressure curves or the adjusted NMR value distributions.

2. The computer-implemented method of claim 1, further comprising validating, with the one or more hardware processors, the corresponding capillary pressure curves and the corresponding NMR value distributions with a plurality of NMR value measurements and capillary pressure measurements taken of the plurality of core samples.

3. The computer-implemented method of claim 2, wherein the corresponding NMR value distributions comprise NMR $T_2$ value distributions, and the plurality of NMR value measurements comprise NMR $T_2$ value measurements.

4. The computer-implemented method of claim 2, wherein adjusting the one or more ML models with the one or more reservoir data of the one or more reservoir formations comprises:
performing, with the one or more hardware processors, a diffusion coupling assessment for each of the one or more reservoir formations;
normalizing, with the one or more hardware processors, the plurality of NMR value measurements with an NMR log data translation process for a plurality of varying operating conditions; and
determining, with the one or more hardware processors, the reservoir formation specific pore throat size distribution from a particular normalized NMR value distribution for a particular reservoir formation of the one or more reservoir formations.

5. The computer-implemented method of claim 1, wherein the (Original) corresponding capillary pressure curves are determined with one or both of a Navier-Stokes simulation or a Lattice-Boltzman simulation.

6. The computer-implemented method of claim 1, wherein the corresponding NMR value distributions are determined with one or more of a finite difference simulation, a finite element simulation, or a Random-Walk simulation.

7. The computer-implemented method of claim 1, wherein the one or more ML models comprises one or more Long-Short-Time-Memory ML models.

8. The computer-implemented method of claim 1, further comprising generating, with the one or more hardware processors, a petrophysical rock type from the reservoir formation specific pore throat size distribution.

9. The computer-implemented method of claim 1, further comprising validating, with the one or more hardware processors, the reservoir formation specific pore throat size distribution with one or more predicted reservoir formation specific pore throat size distributions.

10. The computer-implemented method of claim 1, further comprising generating, with the one or more hardware processors, data to generate a graphical representation of at least one of the reservoir formation specific pore throat size distribution, the adjusted capillary pressure curves, or the adjusted NMR value distributions on a graphical user interface (GUI).

11. The computer-implemented method of claim 1, wherein the corresponding plurality of images comprise at least one of x-ray or microtomography images.

12. A computing system, comprising:
one or more memory modules that store instructions; and
one or more hardware processors communicably coupled to the one or more memory modules and configured to execute the instructions to perform operations, comprising:
generating a plurality of digital models of a plurality of core samples taken from one or more reservoir formations based on a corresponding plurality of images of the plurality of core samples;
determining a pore throat size distribution of the plurality of core samples based on the plurality of digital models;
determining corresponding capillary pressure curves and corresponding nuclear magnetic resonance (NMR) value distributions of the plurality of core samples with one or more numerical simulations;
generating one or more machine-learning (ML) models based on the pore throat size distribution, the corresponding capillary pressure curves, and the corresponding NMR value distributions of the plurality of core samples;
adjusting the one or more ML models with one or more reservoir data of the one or more reservoir formations;
generating adjusted capillary pressure curves and adjusted NMR value distributions from the one or more adjusted ML models; and
determining a reservoir formation specific pore throat size distribution from at least one of the adjusted capillary pressure curves or the adjusted NMR value distributions.

13. The computing system of claim 12, wherein the operations comprise validating the corresponding capillary pressure curves and the corresponding NMR value distributions with a plurality of NMR value measurements and capillary pressure measurements taken of the plurality of core samples.

14. The computing system of claim 13, wherein the corresponding NMR value distributions comprise NMR $T_2$ value distributions, and the plurality of NMR value measurements comprise NMR $T_2$ value measurements.

15. The computing system of claim 13, wherein adjusting the one or more ML models with the one or more reservoir data of the one or more reservoir formations comprises:
performing a diffusion coupling assessment for each of the one or more reservoir formations;
normalizing the plurality of NMR value measurements with an NMR log data translation process for a plurality of varying operating conditions; and
determining the reservoir formation specific pore throat size distribution from a particular normalized NMR value distribution for a particular reservoir formation of the one or more reservoir formations.

16. The computing system of claim 12, wherein the corresponding capillary pressure curves are determined with one or both of a Navier-Stokes simulation or a Lattice-Boltzman simulation.

17. The computing system of claim 12, wherein the corresponding NMR value distributions are determined with one or more of a finite difference simulation, a finite element simulation, or a Random-Walk simulation.

18. The computing system of claim 12, wherein the one or more ML models comprises one or more Long-Short-Time-Memory ML models.

19. The computing system of claim 12, wherein the operations comprise generating a petrophysical rock type from the reservoir formation specific pore throat size distribution.

20. The computing system of claim 12, wherein the operations comprise validating the reservoir formation specific pore throat size distribution with one or more predicted reservoir formation specific pore throat size distributions.

21. The computing system of claim 12, wherein the operations comprise generating data to generate a graphical representation of at least one of the reservoir formation specific pore throat size distribution, the adjusted capillary pressure curves, or the adjusted NMR value distributions on a graphical user interface (GUI).

22. The computing system of claim 12, wherein the corresponding plurality of images comprise at least one of x-ray or microtomography images.

23. An apparatus comprising one or more tangible, non-transitory computer readable media that stores instructions executable by one or more hardware processors communicably coupled to the one or more tangible, non-transitory computer readable media to cause the one or more hardware processors to perform operations, comprising:
generating a plurality of digital models of a plurality of core samples taken from one or more reservoir formations based on a corresponding plurality of images of the plurality of core samples;
determining a pore throat size distribution of the plurality of core samples based on the plurality of digital models;
determining corresponding capillary pressure curves and corresponding nuclear magnetic resonance (NMR) value distributions of the plurality of core samples with one or more numerical simulations;
generating one or more machine-learning (ML) models based on the pore throat size distribution, the corresponding capillary pressure curves, and the corresponding NMR value distributions of the plurality of core samples;
adjusting the one or more ML models with one or more reservoir data of the one or more reservoir formations;
generating adjusted capillary pressure curves and adjusted NMR value distributions from the one or more adjusted ML models; and determining a reservoir formation specific pore throat size distribution from at least one of the adjusted capillary pressure curves or the adjusted NMR value distributions.

24. The apparatus of claim 23, wherein the operations comprise validating the corresponding capillary pressure curves and the corresponding NMR value distributions with a plurality of NMR value measurements and capillary pressure measurements taken of the plurality of core samples.

25. The apparatus of claim 24, wherein the corresponding NMR value distributions comprise NMR $T_2$ value distributions, and the plurality of NMR value measurements comprise NMR $T_2$ value measurements.

26. The apparatus of claim 24, wherein adjusting the one or more ML models with the one or more reservoir data of the one or more reservoir formations comprises:
   performing a diffusion coupling assessment for each of the one or more reservoir formations;
   normalizing the plurality of NMR value measurements with an NMR log data translation process for a plurality of varying operating conditions; and
   determining the reservoir formation specific pore throat size distribution from a particular normalized NMR value distribution for a particular reservoir formation of the one or more reservoir formations.

27. The apparatus of claim 23, wherein the corresponding capillary pressure curves are determined with one or both of a Navier-Stokes simulation or a Lattice-Boltzman simulation.

28. The apparatus of claim 23, wherein the corresponding NMR value distributions are determined with one or more of a finite difference simulation, a finite element simulation, or a Random-Walk simulation.

29. The apparatus of claim 23, wherein the one or more ML models comprises one or more Long-Short-Time-Memory ML models.

30. The apparatus of claim 23, wherein the operations comprise generating a petrophysical rock type from the reservoir formation specific pore throat size distribution.

31. The apparatus of claim 23, wherein validating the reservoir formation specific pore throat size distribution with one or more predicted reservoir formation specific pore throat size distributions.

32. The apparatus of claim 23, wherein the operations comprise generating data to generate a graphical representation of at least one of the reservoir formation specific pore throat size distribution, the adjusted capillary pressure curves, or the adjusted NMR value distributions on a graphical user interface (GUI).

33. The apparatus of claim 23, wherein the corresponding plurality of images comprise at least one of x-ray or microtomography images.

* * * * *